United States Patent
Hagino (10) Patent No.: US 11,923,452 B2
(45) Date of Patent: Mar. 5, 2024

(54) SEMICONDUCTOR DEVICE HAVING SEMICONDUCTOR SWITCHING ELEMENT IN SENSE CELL REGION

(71) Applicant: DENSO CORPORATION, Kariya (JP)

(72) Inventor: Takeshi Hagino, Kariya (JP)

(73) Assignee: DENSO CORPORATION, Kariya (JP)

( * ) Notice: Subject to any disclaimer, the term of this patent is extended or adjusted under 35 U.S.C. 154(b) by 351 days.

(21) Appl. No.: 17/373,869

(22) Filed: Jul. 13, 2021

(65) Prior Publication Data
US 2021/0343864 A1 Nov. 4, 2021

Related U.S. Application Data

(63) Continuation of application No. PCT/JP2020/000489, filed on Jan. 9, 2020.

(30) Foreign Application Priority Data

Jan. 16, 2019 (JP) ................. 2019-005484

(51) Int. Cl.
*H01L 29/78* (2006.01)
*H01L 29/08* (2006.01)

(52) U.S. Cl.
CPC ...... *H01L 29/7815* (2013.01); *H01L 29/0865* (2013.01); *H01L 29/0869* (2013.01); *H01L 29/7813* (2013.01)

(58) Field of Classification Search
CPC ............. H01L 29/7815; H01L 29/0865; H01L 29/0869; H01L 29/7813
See application file for complete search history.

(56) References Cited

U.S. PATENT DOCUMENTS

| 8,928,066 | B2 | 1/2015 | Wutte et al. |
| 2008/0230810 | A1 | 9/2008 | Yoshimura |
| 2011/0309810 | A1* | 12/2011 | Willmeroth ............. H02M 1/36 |
| | | | 323/312 |
| 2018/0183427 | A1 | 6/2018 | Nakajima et al. |
| 2019/0245045 | A1* | 8/2019 | Kataoka ............ H01L 29/66734 |
| 2019/0296149 | A1 | 9/2019 | Yamamoto et al. |
| 2019/0341483 | A1 | 11/2019 | Harada et al. |
| 2020/0083366 | A1* | 3/2020 | Venkatraman .... H01L 29/66734 |
| 2020/0335622 | A1* | 10/2020 | Hiyoshi ............. H01L 29/1608 |

FOREIGN PATENT DOCUMENTS

JP 2010-238993 A 10/2010

* cited by examiner

*Primary Examiner* — Michael Jung
(74) *Attorney, Agent, or Firm* — POSZ LAW GROUP, PLC

(57) ABSTRACT

In a semiconductor device having a main cell region and a sense cell region, a main contact trench and a sense contact trench extend in one direction. When viewed from a stacking direction of a drift layer and a body layer, in the one direction, the main contact trench and a first impurity region disposed in the main cell region protrude more than a main upper electrode toward a sense upper electrode, and the sense contact trench and the first impurity region disposed in the sense cell region protrude more than the sense upper electrode toward the main upper electrode.

5 Claims, 6 Drawing Sheets

SEMICONDUCTOR DEVICE HAVING SEMICONDUCTOR SWITCHING ELEMENT IN SENSE CELL REGION

CROSS REFERENCE TO RELATED APPLICATIONS

The present application is a continuation application of International Patent Application No. PCT/JP2020/000489 filed on Jan. 9, 2020, which designated the U.S. and claims the benefit of priority from Japanese Patent Application No. 2019-005484 filed on Jan. 16, 2019. The entire disclosures of all of the above applications are incorporated herein by reference.

TECHNICAL FIELD

The present disclosure relates to a semiconductor device.

BACKGROUND

Conventionally, a semiconductor device having a main cell region and a sense cell region has been proposed.

SUMMARY

The present disclosure provides a semiconductor device having a main cell region and a sense cell region. In the semiconductor device, a main contact trench and a sense contact trench extend in one direction. When viewed from a stacking direction of a drift layer and a body layer, in the one direction, the main contact trench and a first impurity region disposed in the main cell region protrude more than a main upper electrode toward a sense upper electrode, and the sense contact trench and the first impurity region disposed in the sense cell region protrude more than the sense upper electrode toward the main upper electrode.

BRIEF DESCRIPTION OF DRAWINGS

Objects, features and advantages of the present disclosure will become apparent from the following detailed description made with reference to the accompanying drawings. In the drawings.

DETAILED DESCRIPTION

In a semiconductor device having a main cell region and a sense cell region, same switching elements may be formed in the main cell region and the sense cell region, respectively, and the main cell region and the sense cell region have a predetermined area ratio. As the switching elements, for example, vertical metal oxide semiconductor field effect transistors (MOSFETs) may be formed. The current that flows through the main cell region and the current that flows through the sense cell region depend on the area ratio. Therefore, the current that flows through the main cell region can be detected based on the current that flows through the sense cell region and the area ratio.

However, in the semiconductor device described above, the current ratio between the current that flows through the main cell region and the current that flows through the sense cell region may differ from the area ratio due to a spreading resistance when the current spreads in a plane direction of the semiconductor device. Therefore, for example, in a semiconductor device in which vertical MOSFETs are formed in the main cell region and the sense cell region, respectively, and a lower electrode is common between the main cell region and the sense cell region, an upper electrode in the main cell region and an upper electrode in the sense cell region may be arranged close to each other. According to this configuration, the current is less likely to spread as compared with a configuration in which the upper electrode of the main cell region and the upper electrode of the sense cell region are separated from each other. Therefore, the current ratio between the current that flows through the main cell region and the current that flows through the sense cell region is less likely to differ from the area ratio, and a decrease in the detection accuracy of the current that flows through the main cell region can be suppressed.

However, as a result of studies by the present inventor, it has been confirmed that even in the semiconductor device having the above configuration, it is insufficient to suppress the spread of the current, and there is still room for improvement. In other words, it has been confirmed that there is still room for improvement in the detection accuracy of the current that flows through the main cell region.

A semiconductor device according to an aspect of the present disclosure includes a main cell region and a sense cell region. Each of the main cell region and the sense cell region includes a semiconductor switching element. A current that flows through the semiconductor switching element in the main cell region is detectable based on a current that flows through the semiconductor switching element in the sense cell region. The semiconductor switching element includes a drift layer of a first conductivity type, a body layer of a second conductivity type disposed on the drift layer, a first impurity region of the first conductivity type disposed in a surface layer portion of the body layer and having a higher impurity concentration than the drift layer, a gate insulating film disposed on a surface of the body layer positioned between the first impurity region and drift layer, a gate electrode disposed on the gate insulating film, a second impurity region of the first conductivity type or the second conductivity type disposed on an opposite side of the drift layer from the body layer and having a higher impurity concentration than the drift layer, a first electrode electrically connected with the first impurity region and the body layer, and a second electrode electrically connected with the second impurity region. The main cell region is provided with a main contact trench. The main contract trench extends in one direction and exposes the first impurity region and the body layer. The sense cell region is provided with a sense contact trench. The sense contact trench extends in the one direction, exposes the first impurity region and the body layer, and is separated from the main contact trench. In each of the main contact trench and the sense contact trench, a connection electrode electrically connected with the first impurity region and the body layer is disposed. The first electrode includes a main upper electrode and a sense upper electrode. The main upper electrode is connected with the connection electrode disposed in the main contact trench. The sense upper electrode is connected with the connection electrode disposed in the sense contact trench and is separated from the main upper electrode. When viewed from a stacking direction of the drift layer and the body layer, in the one direction, the main contact trench and the first impurity region disposed in the main cell region protrude more than the main upper electrode toward the sense upper electrode, and the sense contact trench and the first impurity region disposed in the sense cell region protrude more than the sense upper electrode toward the main upper electrode.

According to this configuration, the distance between the first impurity region disposed in the main cell region and the first impurity region disposed in the sense cell region can be made shorter than the distance between the main upper electrode and the sense upper electrode. That is, the main cell region and the sense cell region can be arranged closer to each other. Therefore, it is possible to suppress the current from spreading in the plane direction of the semiconductor device. Therefore, the current ratio between the current that flows through the main cell region and the current that flows through the sense cell region is unlikely to differ from the area ratio. As a result, it is possible to suppress a decrease in the detection accuracy of the current that flows through the main cell region.

Embodiments of the present disclosure will be described below with reference to the drawings. In the following embodiments, the same or equivalent parts are denoted by the same reference numerals for description.

First Embodiment

Figure 1:
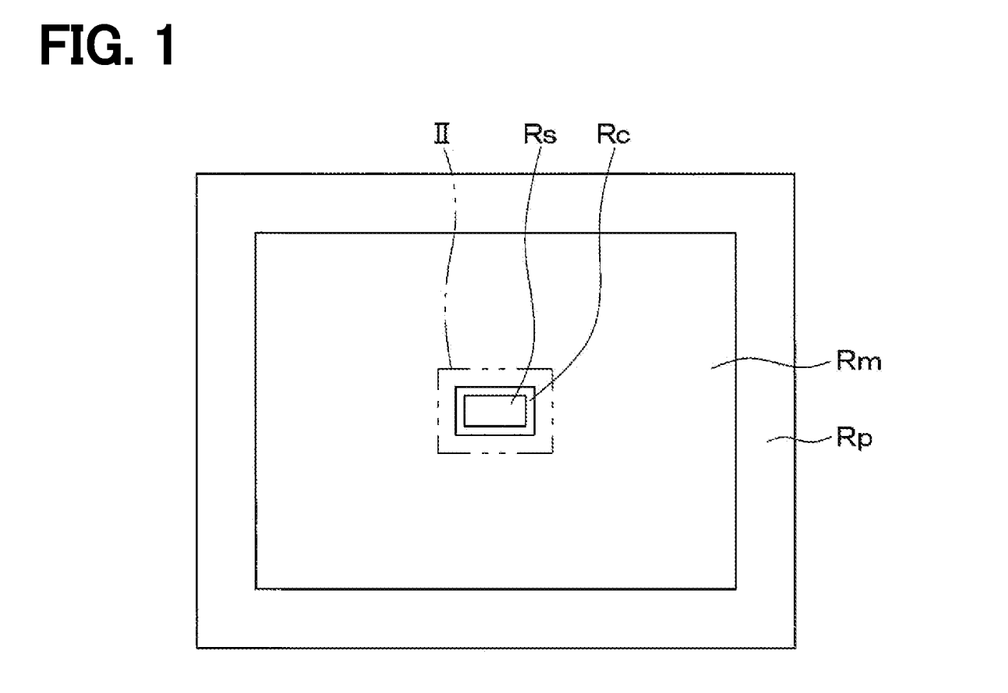
FIG. 1 is a schematic plan view of a semiconductor device according to a first embodiment.

A first embodiment will be described with reference to the drawings. As shown in FIG. 1, a semiconductor device of the present embodiment has a main cell region Rm, a sense cell region Rs, an intermediate region Rc, and a peripheral region Rp. The semiconductor device is configured such that the sense cell region Rs is surrounded by the main cell region Rm via the intermediate region Rc, and the main cell region Rm is surrounded by the peripheral region Rp.

Figure 2:
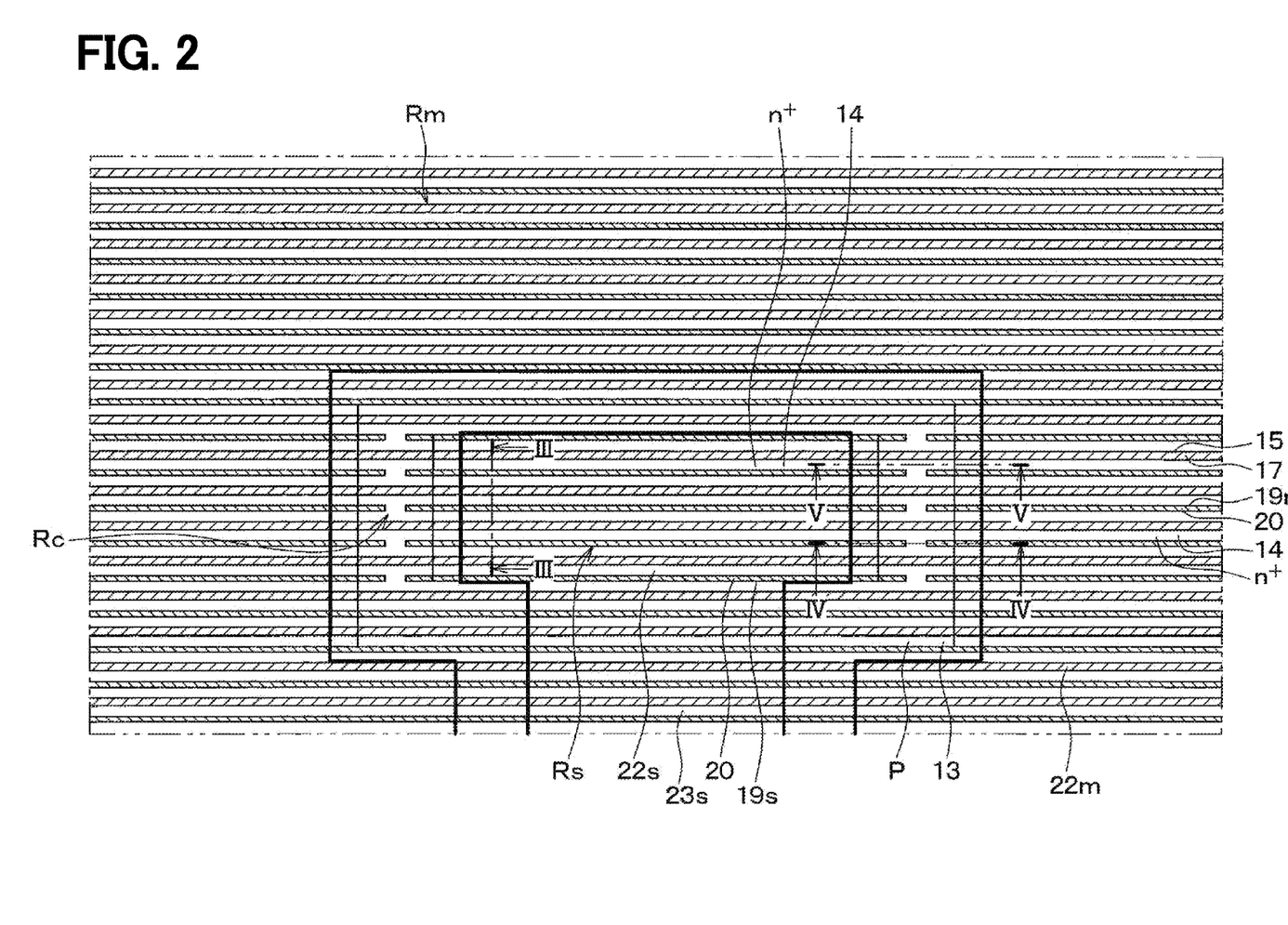
FIG. 2 is an enlarged plan view of region II shown in FIG. 1.
Figure 3:
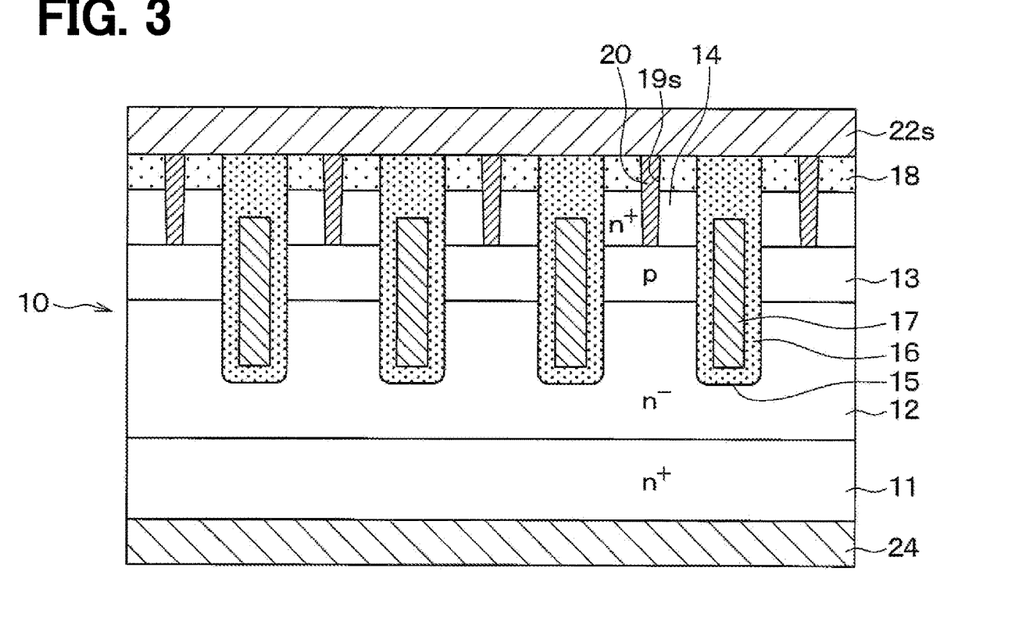
FIG. 3 is a cross-sectional view of the semiconductor device taken along line III-III shown in FIG. 2.

Hereinafter, configurations of the main cell region Rm and the sense cell region Rs will be described with reference to FIG. 2 to FIG. 5. In the present embodiment, each of the main cell region Rm and the sense cell region Rs is provided with an n-channel type vertical MOSFET having a similar structure. That is, the cross-sectional view of FIG. 3 is a cross-sectional view of the sense cell region Rs, but the cross-sectional view of the main cell region Rm is similar.

The main cell region Rm and the sense cell region Rs are formed so as to have a predetermined area ratio. In the semiconductor device of the present embodiment, the current that flows through the sense cell region Rs is detected, and the current that flows in the main cell region Rm is detected (that is, calculated) based on the detected current of the sense cell region Rs and area ratio.

The semiconductor device includes a semiconductor substrate 10 having a drain layer 11 made of an n$^+$ type silicon substrate. On the drain layer 11, an n$^-$ type drift layer 12 having a lower impurity concentration than the drain layer 11 is disposed. On the drift layer 12, a p type body layer 13 having a relatively low impurity concentration is disposed. A surface layer portion of the body layer 13 is provided with a source region 14 having a higher impurity concentration than the drift layer 12. In the present embodiment, the drain layer 11 corresponds to a second impurity region, and the source region 14 corresponds to a first impurity region.

In the semiconductor substrate 10, gate trenches 15 penetrate the source region 14 and the body layer 13 and reach the drift layer 12. In each of the gate trenches 15, a gate insulating film 16 is formed so as to cover a surface of an inner wall surface, and a gate electrode 17 made of doped polysilicon is embedded via the gate insulating film 16. As a result, a trench gate structure is formed. In the present embodiment, as shown in FIG. 2, the gate trenches 15 have a longitudinal direction in one direction, that is, a left-right direction in FIG. 2, and arranged in a striped manner. Further, the gate trenches 15 are configured so that portions formed in the main cell region Rm and portions formed in the sense cell region Rs are connected to each other. That is, the gate trenches 15 extend from the main cell region Rm to the sense cell region Rs via the intermediate region Rc.

Although FIG. 2 is not a cross-sectional view, the gate electrodes 17 and connection electrodes 20 described later are hatched for easy understanding. Further, in FIG. 2, the gate insulating films 16 arranged in the gate trenches 15, interlayer insulating films 18, 21 and the like are omitted.

In the present embodiment, the source region 14 is formed in the main cell region Rm and the sense cell region Rs, and is not formed in the intermediate region Rc. That is, in the present embodiment, a portion where the source region 14 is formed is the main cell region Rm or the sense cell region Rs, and a portion where the source region 14 is not formed is the intermediate region Rc. In other words, in the present embodiment, the regions are divided by whether or not the source region 14 is formed.

On the semiconductor substrate 10, a first interlayer insulating film 18 made of an oxide film or the like is formed. Contact trenches 19$m$ and 19$s$ are provided so as to penetrate the first interlayer insulating film 18 and the source region 14 and reach the body layer 13. As a result, the source region 14 is exposed from side surfaces of the contact trenches 19$m$ and 19$s$, and the body layer 13 is exposed from bottoms of the contact trenches 19$m$ and 19$s$.

In the present embodiment, the contact trenches 19$m$ and 19$s$ are provided between the adjacent gate trenches 15 in the sense cell region Rs and the main cell region Rm along the extending direction of the gate trenches 15. That is, the longitudinal direction of the contact trenches 19$m$ and 19$s$ is parallel to the longitudinal direction of the gate trenches 15.

However, the contact trenches 19$m$ and 19$s$ are provided so that portions provided in the sense cell region Rs and portions provided in the main cell region Rm are separated. Hereinafter, the contact trenches 19$m$ provided in the main cell region Rm are referred to as main contact trenches 19$m$, and the contact trenches 19$s$ provided in the sense cell region Rs are referred to as sense contact trenches 19$s$.

In the main contact trenches 19$m$ and the sense contact trenches 19$s$, the connection electrodes 20 are respectively embedded. In the present embodiment, tungsten is embedded as the connection electrodes 20.

Further, on the semiconductor substrate 10, a second interlayer insulating film 21 is formed. The second interlayer insulating film 21 has contact holes 21$a$ for exposing a part of the connection electrodes 20 formed in the main cell region Rm and the sense cell region Rs. The second interlayer insulating film 21 is made of an oxide film or the like.

Then, a main upper electrode 22$m$ is formed in the main cell region Rm, and sense upper electrode 22$s$ is formed in the sense cell region Rs so as to be electrically connected to the connection electrodes 20 through the contact holes 21a.

In the present embodiment, the main upper electrode 22m is formed in a quadrangular frame shape in which a part is cut out, as shown in FIG. 2. The sense upper electrode 22s has a quadrangular shape, and is arranged so as to be surrounded by the main upper electrode 22m. One side of the sense upper electrode 22s is connected to a lead wiring 23s and is lead out to the outside of the main cell region Rm through a notch provided in the main upper electrode 22m. Further, although not particularly shown, in the peripheral region Rp in FIG. 1, a pad portion connected to the main upper electrode 22m is formed, and a pad portion connected to the sense upper electrode 22s is formed. In the present embodiment, the main upper electrode 22m and the sense upper electrode 22s correspond to a first electrode.

On a rear surface of the semiconductor substrate 10, a lower electrode 24 corresponding to a drain electrode is formed. The lower electrode 24 is formed on the entire rear surface of the semiconductor substrate 10, and is common between the main cell region Rm and the sense cell region Rs. In the present embodiment, the lower electrode 24 corresponds to a second electrode.

The basic structure of the semiconductor device according to the present embodiment is described above. In the semiconductor device described above, when a predetermined voltage is applied to the gate electrodes 17, an inversion layer is formed in the body layer 13 and a current flows. In the present embodiment, n⁻ type and n⁺ type correspond to a first conductivity type, and p type corresponds to a second conductivity type.

Next, a positional relationship among the main upper electrode 22m, the main contact trench 19m, and the source region 14 formed in the main cell region Rm in the present embodiment will be described. Further, a relationship among the sense upper electrode 22s, the sense contact trench 19s, and the source region 14 formed in the sense cell region Rs will be described. In the following, the normal direction with respect to the plane direction of the semiconductor substrate 10 is also simply referred to as a normal direction. However, since the semiconductor device of the present embodiment is configured as described above, the normal direction can be referred to as a stacking direction of the drift layer 12 and the body layer 13.

Figure 4:
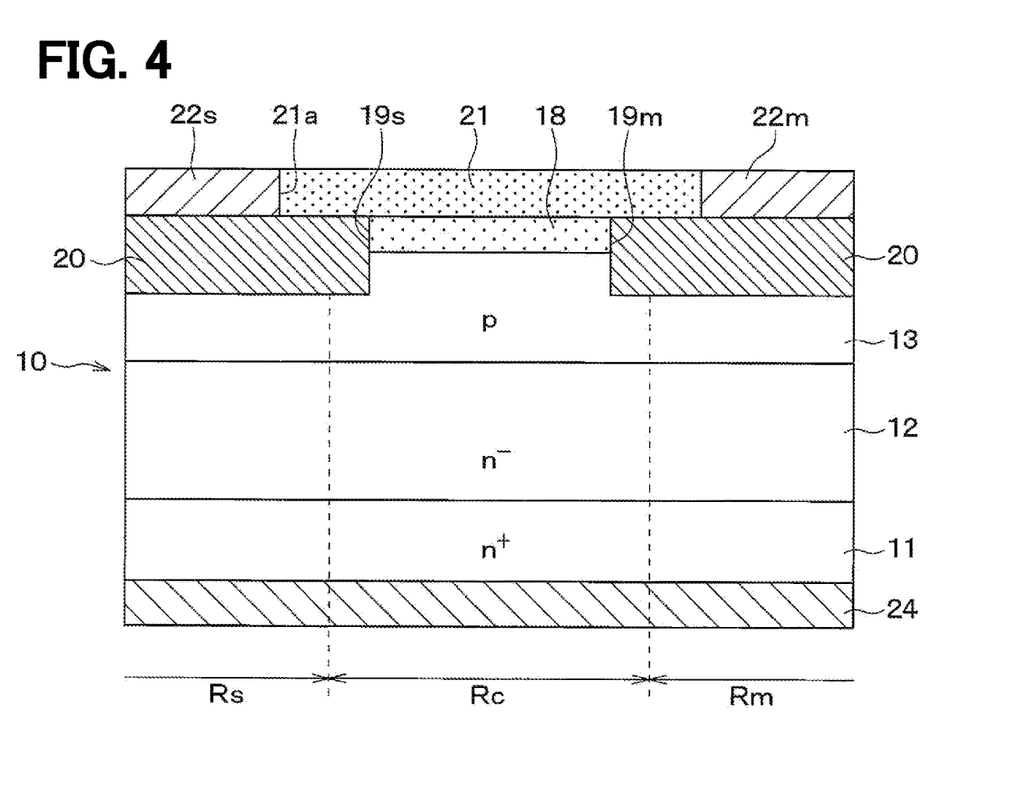
FIG. 4 is a cross-sectional view of the semiconductor device taken along line IV-IV shown in FIG. 2.

In the present embodiment, as shown in FIG. 2 and FIG. 4, the main contact trench 19m protrudes from the main upper electrode 22m in the longitudinal direction when viewed from the normal direction (that is, the stacking direction). Specifically, the main contact trench 19m is provided so as to protrude more than the main upper electrode 22m toward the sense cell region Rs when viewed from the normal direction. Similarly, when viewed from the normal direction, the sense contact trench 19s is provided so as to protrude from the sense upper electrode 22s in the longitudinal direction. Specifically, the sense contact trench 19s is provided so as to protrude more than the sense upper electrode 22s toward the main cell region Rm when viewed from the normal direction.

Figure 5:
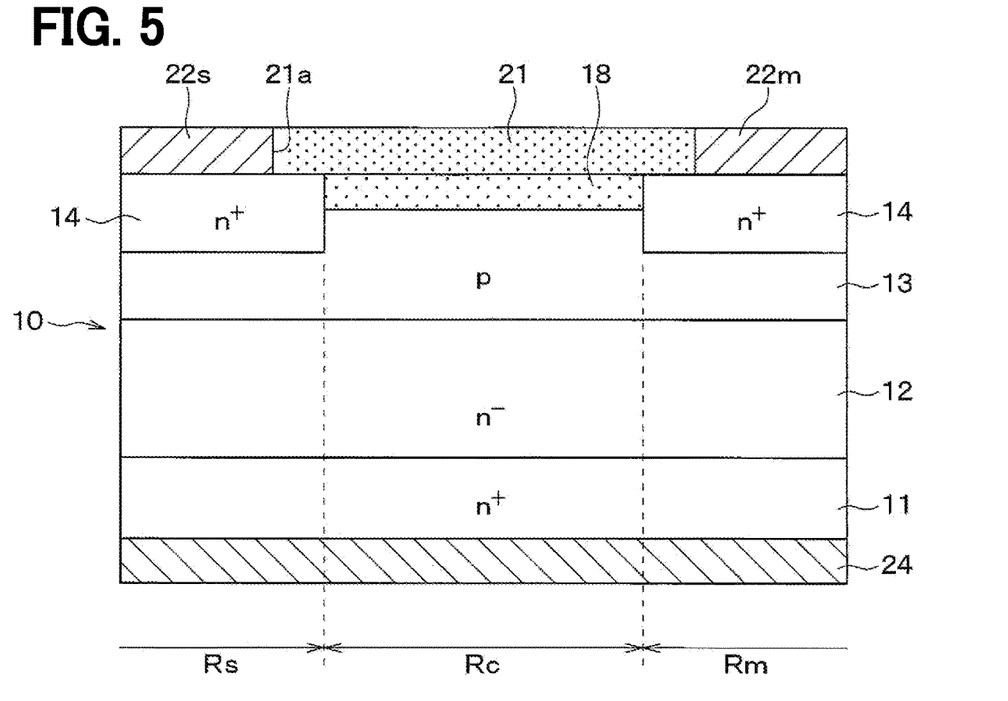
FIG. 5 is a cross-sectional view of the semiconductor device taken along line V-V shown in FIG. 2.

Further, as shown in FIG. 2 and FIG. 5, when viewed from the normal direction, the source region 14 formed in the main cell region Rm protrudes from the main upper electrode 22m in the longitudinal direction. Specifically, when viewed from the normal direction, the source region 14 formed in the main cell region Rm protrudes more than the main upper electrode 22m toward the sense cell region Rs. Similarly, when viewed from the normal direction, the source region 14 formed in the sense cell region Rs protrudes from the sense upper electrode 22s in the longitudinal direction. Specifically, when viewed from the normal direction, the source region 14 formed in the sense cell region Rs protrudes more than the sense upper electrode 22s toward the main cell region Rm.

However, in the present embodiment, the main contact trench 19m is formed so as to protrude more than the source region 14 formed in the main cell region Rm. Similarly, the sense contact trench 19s is provided so as to protrude more than the source region 14 formed in the sense cell region Rs.

As described above, in the present embodiment, the main contact trench 19m and the source region 14 formed in the main cell region Rm are formed so as to protrude more the main upper electrode 22m toward the sense cell region Rs in the longitudinal direction. Further, the sense contact trench 19s and the source region 14 formed in the sense cell region Rs are formed so as to protrude more than the sense upper electrode 22s toward the main cell region Rm in the longitudinal direction. Therefore, according to the present embodiment, a distance between the source region 14 formed in the main cell region Rm and the source region 14 formed in the sense cell region Rs can be shorter than a distance between the main upper electrode 22m and the sense upper electrode 22s. That is, the main cell region Rm and the sense cell region Rs can be arranged closer to each other. Therefore, it is possible to suppress the current from spreading in the plane direction of the semiconductor substrate 10. Therefore, the current ratio between the current that flows through the main cell region Rm and the current that flows through the sense cell region Rs is unlikely to differ from the area ratio. As a result, it is possible to suppress a decrease in the detection accuracy of the current that flows through the main cell region Rm.

Further, in the present embodiment, in the longitudinal direction, the main contact trench 19m is provided so as to protrude more than the source region 14 formed in the main cell region Rm toward the sense cell region Rs. Similarly, the sense contact trench 19s is provided so as to protrude more than the source region 14 formed in the sense cell region Rs toward the main cell region Rm. Therefore, as shown in FIG. 6, it is possible to suppress the operation of the parasitic transistor composed of the n type source region 14, the p type body layer 13, and the n type drift layer 12.

Figure 6:
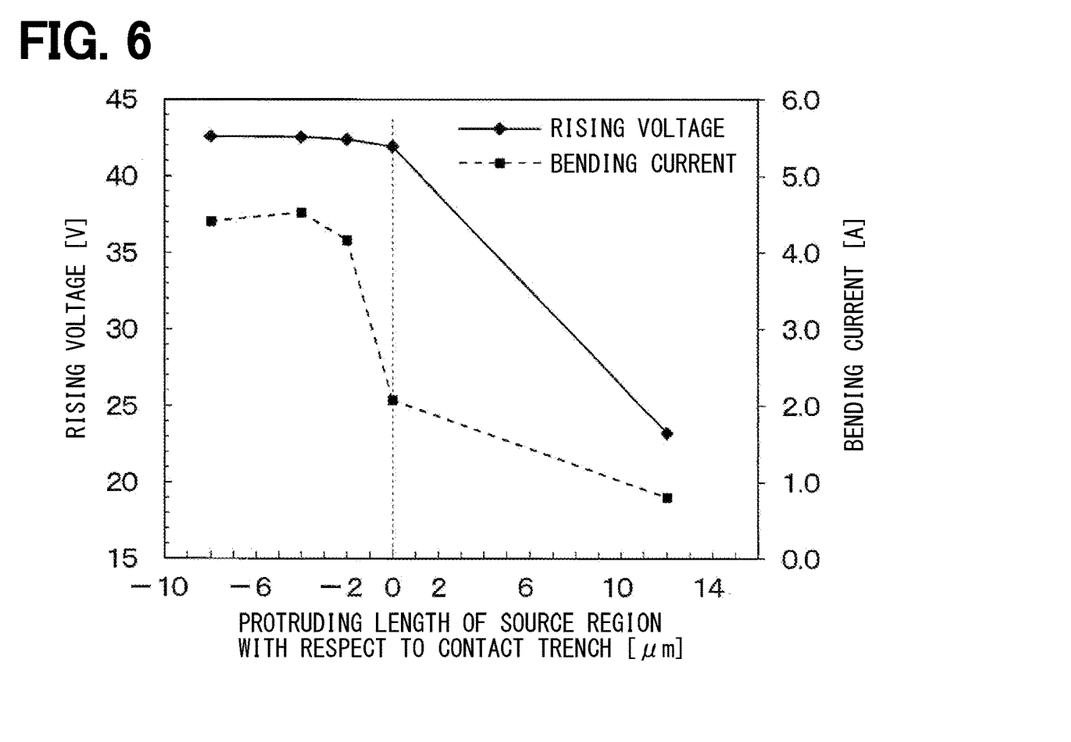
FIG. 6 is a diagram showing experimental results of investigating a relationship between a protruding length of a source region with respect to a contact trench and a rising voltage and a bending current.

In FIG. 6, a rising voltage indicates a voltage immediately after the current starts to flow through the semiconductor device. The parasitic transistor becomes difficult to operate with increase in the rising voltage. Further, in FIG. 6, a bending current indicates a current that can be passed through the semiconductor device when the current starts to flow through the semiconductor device. The parasitic transistor becomes difficult to operate with increase in the being current. Further, in FIG. 6, a protruding length of the source region with respect to the contact trench indicates that the source region 14 protrudes more than the contact trenches 19m and 19s if the protruding length is a positive value, and indicates that the contact trenches 19m and 19s protrude more than the source region 14 if the protruding length is a negative value.

Second Embodiment

A second embodiment will be described. In the present embodiment, the configuration of the body layer 13 is changed from that of the first embodiment. Other configurations are the same as those of the first embodiment, and therefore a description of the same configurations will be omitted.

Figure 7:
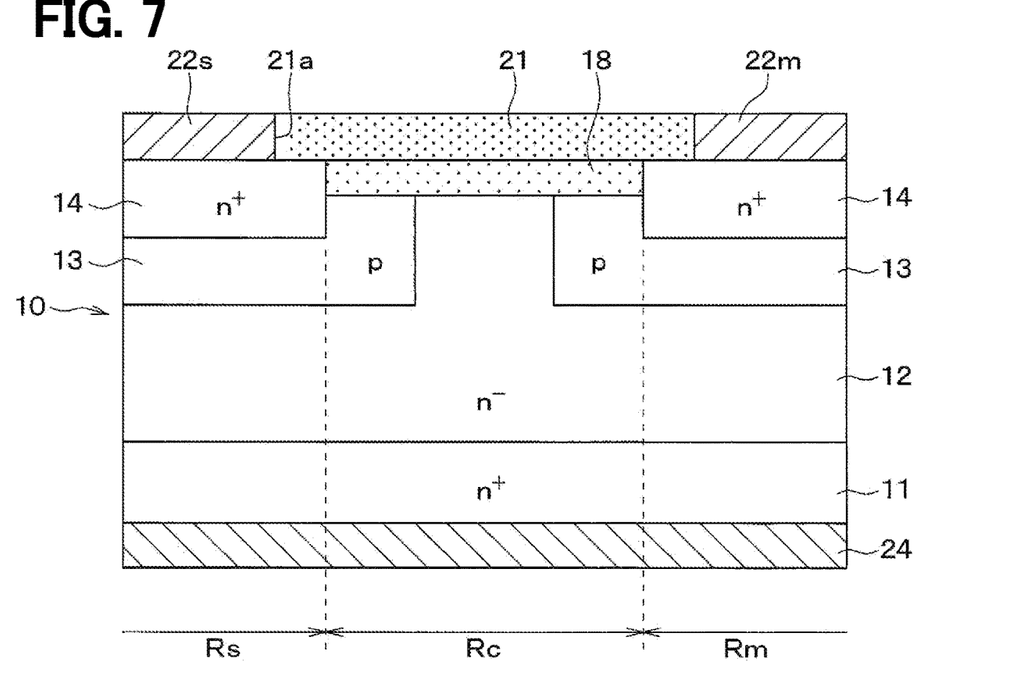
FIG. 7 is a cross-sectional view of a semiconductor device according to a second embodiment.

In the present embodiment, as shown in FIG. 7, the body layer 13 formed in the sense cell region Rs and the body layer 13 formed in the main cell region Rm are separated from each other. The drift layer 12 is arranged between the body layer 13 formed in the sense cell region Rs and the body layer 13 formed in the main cell region Rm. That is, in the intermediate region Rc, there is a portion where the body layer 13 is not formed. The portion of the intermediate region Rc where the body layer 13 is not formed is configured to make one circuit to surround the sense cell region Rs. FIG. 7 corresponds to a cross-sectional view taken along line V-V shown in FIG. 2.

As described above, in the present embodiment, the body layer 13 formed in the sense cell region Rs and the body layer 13 formed in the main cell region Rm are divided from each other. Therefore, a portion that is difficult to operate as a MOSFET is formed in the intermediate region Rc, and no current flows through the portion. Therefore, it is possible to suppress the current from spreading in the plane direction of the semiconductor substrate 10, and it is possible to further improve the detection accuracy.

If the body layer 13 of the main cell region Rm protrudes more than the source region 14 toward the sense cell region Rs, the positional relationship with the main contact trench 19m can be changed as appropriate. That is, the body layer 13 of the main cell region Rm may protrude more than the main contact trench 19m toward the sense cell region Rs, or the main contact trench 19m may protrude more than the body layer 13 of the main cell region Rm toward the sense cell region Rs. Similarly, if the body layer 13 of the sense cell region Rs protrude more than the source region 14 toward the main cell region Rm, the positional relationship with the sense contact trench 19s can be changed as appropriate. That is, the body layer 13 of the sense cell region Rs may protrude more than the sense contact trench 19s toward the main cell region Rm, or the sense contact trench 19s may protrude more than the body layer 13 of the sense cell region Rs toward the main cell region Rm.

Third Embodiment

A third embodiment will be described. In the present embodiment, the configuration of the body layer 13 is changed from that of the second embodiment. Other configurations are the same as those of the second embodiment, and therefore a description of the same configurations will be omitted.

Figure 8:
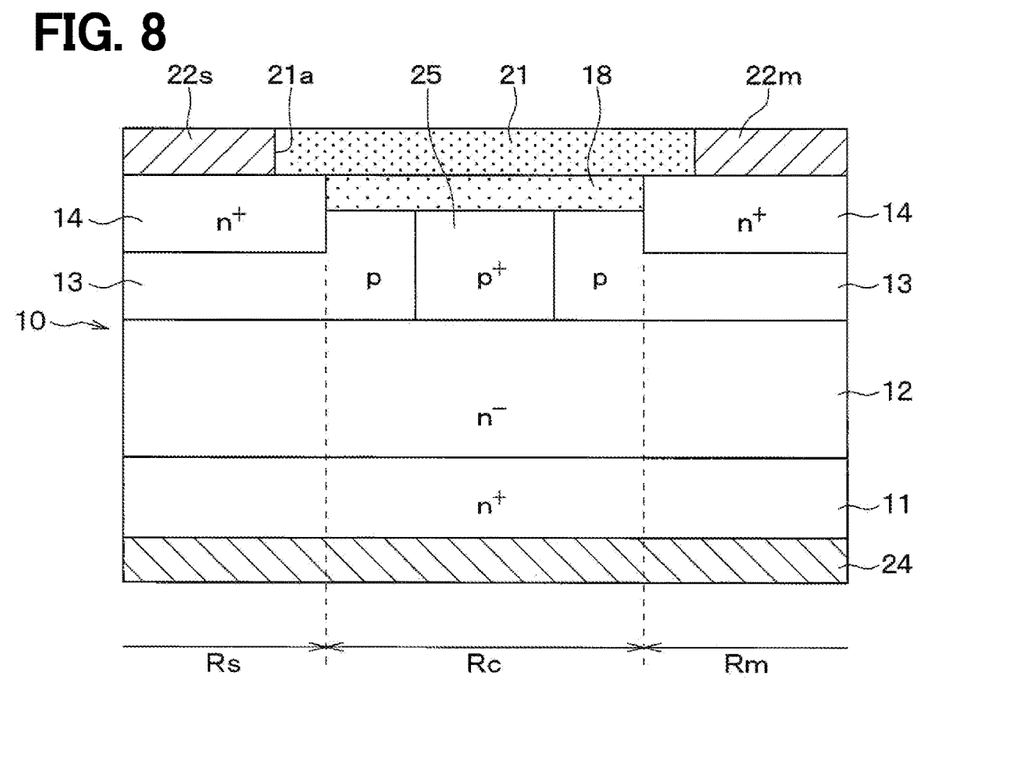
FIG. 8 is a cross-sectional view of a semiconductor device according to a third embodiment.

In the present embodiment, as shown in FIG. 8, the body layer 13 formed in the sense cell region Rs and the body layer 13 formed in the main cell region Rm are separated by a separation layer 25 formed in the intermediate region Rc. In the present embodiment, the separation layer 25 is made of a p+ type region having a higher impurity concentration than the body layer 13. The separation layer 25 is configured to make one circuit to surround the sense cell region Rs. Further, FIG. 8 corresponds to a cross-sectional view taken along line V-V shown in FIG. 2.

Even in the semiconductor device described above, since the current becomes difficult to flow through the portion where the separation layer 25 is formed, the same effect as that of the second embodiment can be obtained.

Fourth Embodiment

A fourth embodiment will be described. In the present embodiment, the planar shapes of the main cell region Rm and the sense cell region Rs are changed from those of the first embodiment. Other configurations are the same as those of the first embodiment, and therefore a description of the same configurations will be omitted.

Figure 9:
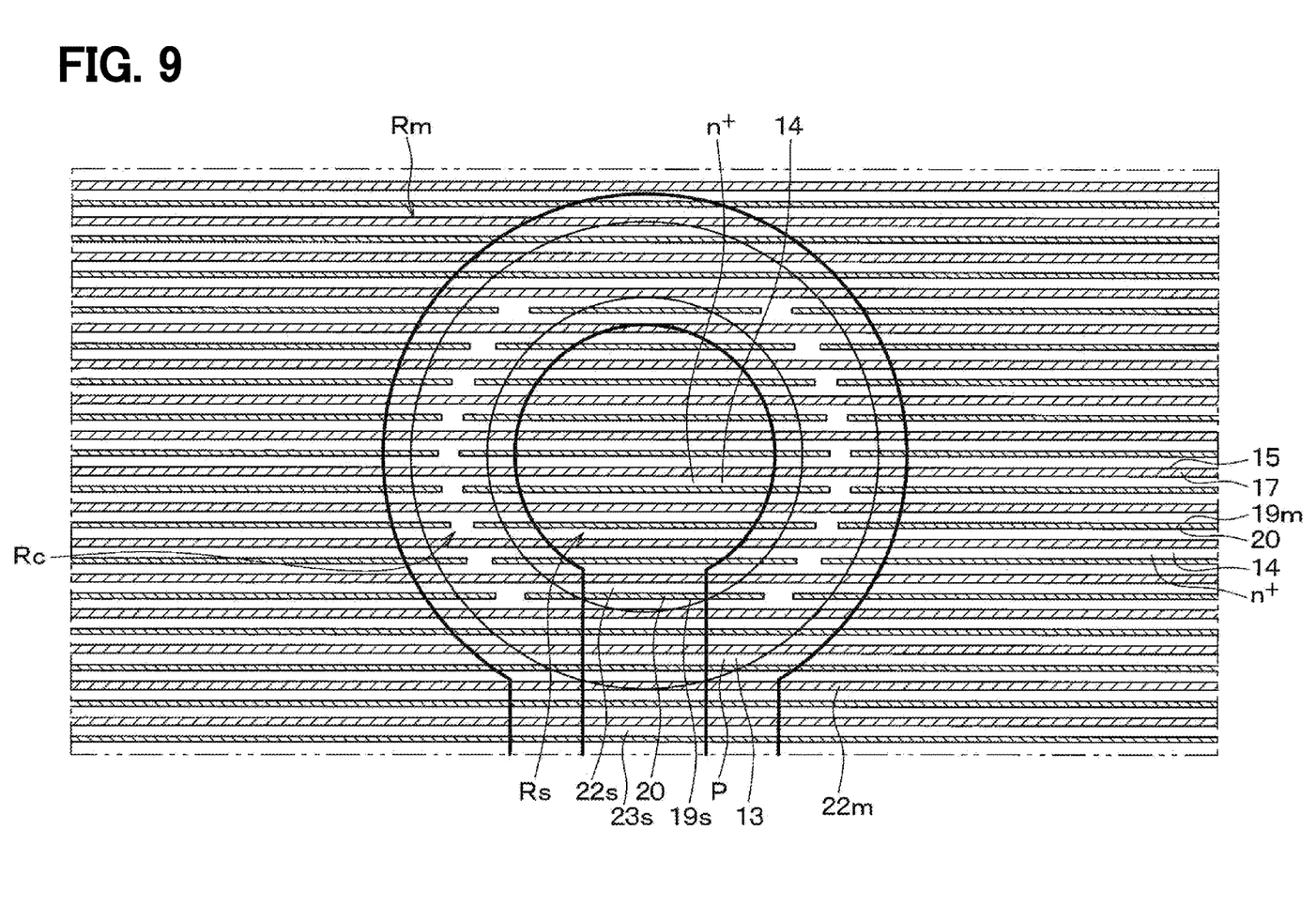
FIG. 9 is a schematic plan view of a semiconductor device according to a fourth embodiment.

In the present embodiment, as shown in FIG. 9, the sense cell region Rs has a circular shape when viewed from the normal direction. In the present disclosure, the term of "circular shape" includes substantially circular shape. The main cell region Rm is formed so that a distance from an outer edge portion of the sense cell region Rs is constant along a circumferential direction of an outer circumference of the sense cell region Rs. When viewed from the normal direction, the sense upper electrode 22s has a circular shape, and the main upper electrode 22m has a circular frame shape in which a part is cut out. Then, the sense upper electrode 22s is lead out to the outside of the main cell region Rm through a notch formed in the main upper electrode 22m, as in the first embodiment. Note that FIG. 9 corresponds to an enlarged view of the region II shown in FIG. 1.

According to this configuration, the distance between the main cell region Rm and the sense cell region Rs is made uniform along the outer circumference of the sense cell region Rs. Therefore, the influence of the lateral spreading of the current uniformly affects the sense cell region Rs, and the design can be facilitated.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and forms, and further, other combinations and forms including only one element, or more or less than these elements are also within the scope of the present disclosure.

For example, in the above-described embodiments, the MOSFET of the n channel type trench gate structure in which the first conductivity type is n type and the second conductivity type is p type has been described as an example of the semiconductor switching element. However, this is merely an example, and a semiconductor switching element of another structure, for example, a MOSFET of a trench gate structure of a p channel type in which the conductivity type of each component is inverted with respect to the n channel type may also be used. In addition to the MOSFET, each of the above embodiments can be applied to an insulated gate bipolar transistor (IGBT) having a similar structure. In the case of the IGBT, it is the same as the vertical MOSFET described in each of the above-described embodiments except that the drain layer 11 is changed to a p type collector layer. Further, each of the above-described embodiments can be applied to a semiconductor device having a planar gate structure instead of the trench gate structure.

Further, each of the embodiments may be changed as appropriate. For example, the fourth embodiment may be combined with the second embodiment or the third embodiment.

What is claimed is:
1. A semiconductor device comprising:
a main cell region; and
a sense cell region, wherein
each of the main cell region and the sense cell region
includes a semiconductor switching element,
the semiconductor switching element includes:
a drift layer of a first conductivity type;

a body layer of a second conductivity type disposed on the drift layer;

a first impurity region of the first conductivity type disposed in a surface layer portion of the body layer and having a higher impurity concentration than the drift layer;

a gate insulating film disposed on a surface of the body layer positioned between the first impurity region and drift layer;

a gate electrode disposed on the gate insulating film;

a second impurity region of the first conductivity type or the second conductivity type disposed on an opposite side of the drift layer from the body layer and having a higher impurity concentration than the drift layer;

a first electrode electrically connected with the first impurity region and the body layer; and a second electrode electrically connected with the second impurity region, the main cell region is provided with a main contact trench, the main contact trench extends in one direction and exposes the first impurity region and the body layer, the sense cell region is provided with a sense contact trench, the sense contact trench extends in the one direction, exposes the first impurity region and the body layer, and is separated from the main contact trench, in each of the main contact trench and the sense contact trench, a connection electrode electrically connected with the first impurity region and the body layer is disposed, the first electrode includes a main upper electrode and a sense upper electrode, the main upper electrode is connected with the connection electrode disposed in the main contact trench, the sense upper electrode is connected with the connection electrode disposed in the sense contact trench and is separated from the main upper electrode, when viewed from a stacking direction of the drift layer and the body layer, in the one direction, the main contact trench and the first impurity region disposed in the main cell region protrude more than the main upper electrode toward the sense upper electrode, and the sense contact trench and the first impurity region disposed in the sense cell region protrude more than the sense upper electrode toward the main upper electrode, and when viewed from the stacking direction, in the one direction, the main contact trench protrudes more than the first impurity region disposed in the main cell region toward the sense upper electrode, and the sense contact trench protrudes more than the first impurity region disposed in the sense cell region toward the main upper electrode, wherein a current that flows through the semiconductor switching element in the main cell region is detectable based on a current that flows through the semiconductor switching element in the sense cell region.

2. The semiconductor device according to claim 1, wherein
the body layer disposed in the main cell region and the body layer disposed in the sense cell region are separated from each other.

3. The semiconductor device according to claim 2, wherein
the drift layer is arranged between the body layer disposed in the main cell region and the body layer disposed in the sense cell region.

4. The semiconductor device according to claim 2, further comprising
a separation layer of the second conductivity type having a higher impurity concentration than the body layer, and disposed between the body layer disposed in the main cell region and the body layer disposed in the sense cell region.

5. The semiconductor device according to claim 1, wherein
when viewed from the stacking direction, the sense cell region has a circular shape, and a distance between the main cell region and an outer edge portion of the sense cell region is constant in a circumferential direction of an outer circumference of the sense cell region.

* * * * *